(12) United States Patent
Tan

(10) Patent No.: US 6,288,611 B1
(45) Date of Patent: Sep. 11, 2001

(54) APPARATUS AND METHOD TO TRIM A PROGRAMMABLE LOW-FREQUENCY MONOLITHIC HIGH-PASS FILTER

(75) Inventor: Mehmet Ali Tan, Irvine, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/398,592

(22) Filed: Sep. 17, 1999

(51) Int. Cl.[7] ............................... H03G 3/20; H03F 3/191
(52) U.S. Cl. ............................................. 330/284; 330/303
(58) Field of Search ..................................... 330/134, 144, 330/145, 284, 303, 305, 306

(56) References Cited

U.S. PATENT DOCUMENTS

| | | |
|---|---|---|
| 5,208,548 * | 5/1993 | Van Riezen .............................. 330/59 |
| 5,410,729 * | 4/1995 | Kumagai et al. ................. 330/284 X |

* cited by examiner

*Primary Examiner*—Steven J. Mottola
(74) *Attorney, Agent, or Firm*—W. Daniel Swayze, Jr.; W. James Brady; Frederick J. Telecky, Jr.

(57) ABSTRACT

A high-pass filter has a variable resistance which can be varied by a trimming signal and a programming signal. The variable resistance has a common resistance which is controlled by the trimming signal or the programming signal through a common control line.

4 Claims, 4 Drawing Sheets

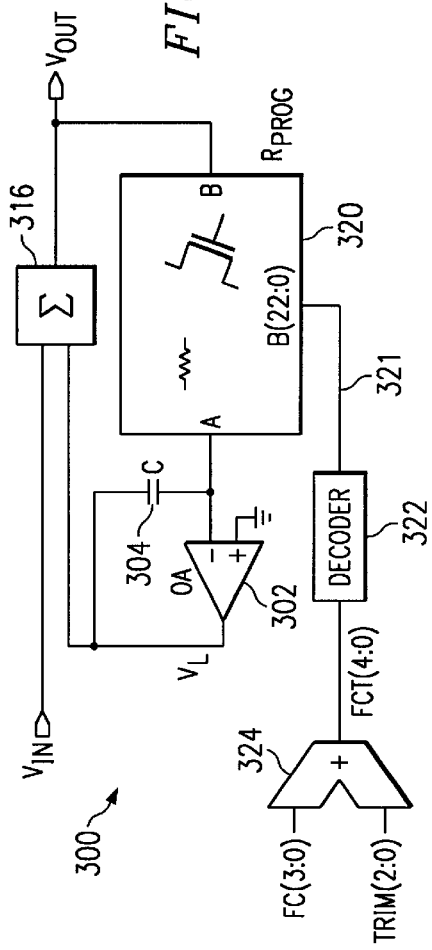
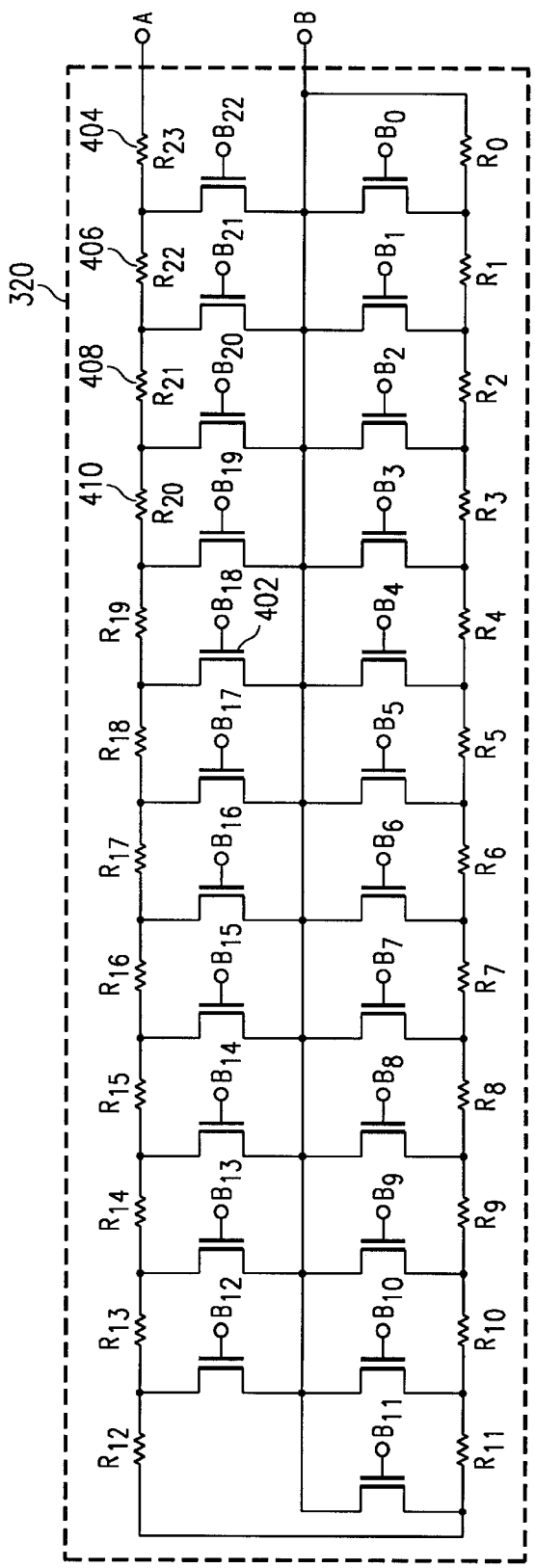
FIG. 3
FIG. 4

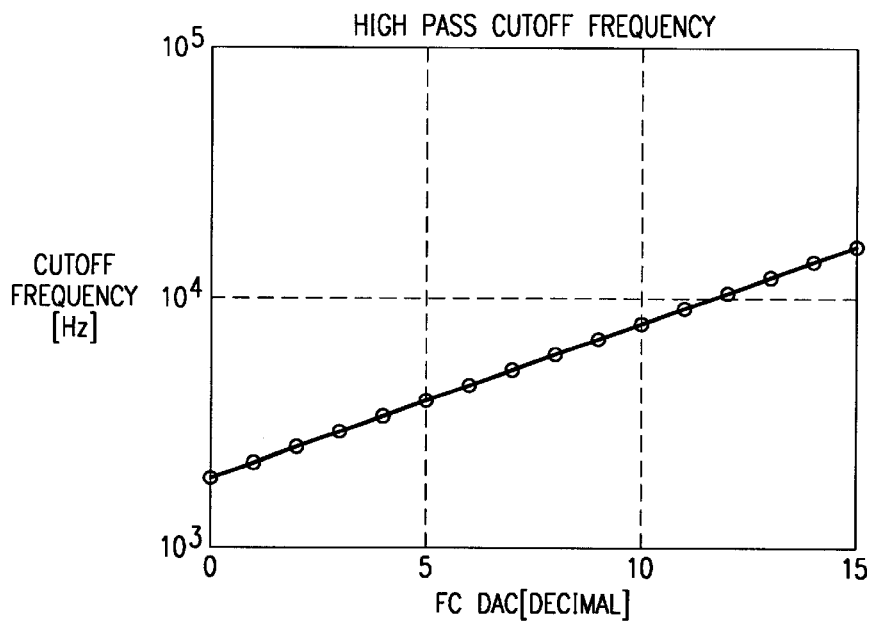
FIG. 7
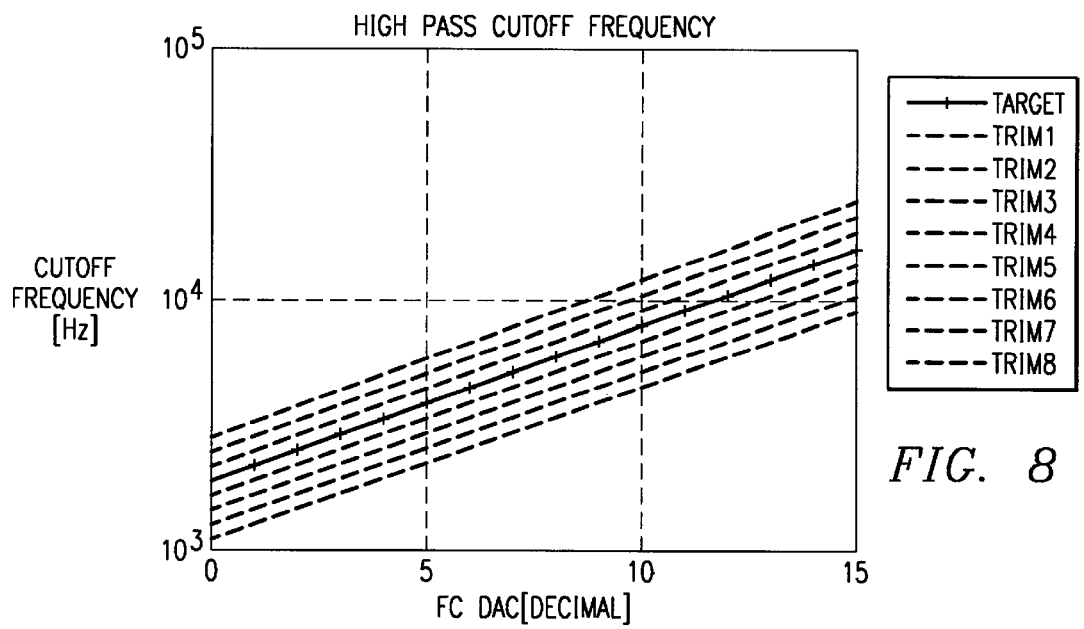
FIG. 8
| $R_{23}$=2.589E+04 | $R_{17}$=8.229E+04 | $R_{11}$=1.951E+04 | $R_5$=4.627E+04 |
| --- | --- | --- | --- |
| $R_{22}$=4.007E+03 | $R_{16}$=9.503E+04 | $R_{10}$=2.253E+04 | $R_4$=5.344E+04 |
| $R_{21}$=4.627E+03 | $R_{15}$=1.097E+04 | $R_9$=2.602E+04 | $R_3$=6.171E+04 |
| $R_{20}$=5.344E+03 | $R_{14}$=1.267E+04 | $R_8$=3.005E+04 | $R_2$=7.126E+04 |
| $R_{19}$=6.171E+03 | $R_{13}$=1.463E+04 | $R_7$=3.470E+04 | $R_1$=8.229E+04 |
| $R_{18}$=7.126E+03 | $R_{12}$=1.690E+04 | $R_6$=4.007E+04 | $R_0$=9.503E+04 |
FIG. 9

APPARATUS AND METHOD TO TRIM A PROGRAMMABLE LOW-FREQUENCY MONOLITHIC HIGH-PASS FILTER

FIELD OF THE INVENTION

The present invention relates to a filter circuit and more particularly to a programmable monolithic high-pass filter.

BACKGROUND OF THE INVENTION

Monolithic differential high-pass filters are used in many mixed signal integrated analog circuits as well as read channels for disk drive circuits in order to eliminate the effect of offset which is generated by internal circuitry. The offsets are often the result of mismatches which are due to various factors such as component mismatches, temperature gradient, etc. The lower cutoff frequency ($F_C$) of the high-pass filter is usually within the range of a few kilohertz to a few hundred kilohertz. The low frequency cutoff $F_C$ is chosen such that it should be sufficiently low in order to prevent any phase distortion on the output signal, and it should be sufficiently high in order to avoid slow transition in startup of the component. In applications where the data rate or the signal frequency shows a large amount of variation in various modes, it is desirable to have a programmable high-pass filter to be able to optimize the operation. Trimming may be necessary since the component tolerances may result in larger deviation than the programming of the high-pass filter. The programmability can only be achieved if the process variation is corrected by trimming and if the trimming accuracy is less than or equal to half of the step sizes in the programming.

FIG. 1 illustrates such a high-pass filter in monolithic form with $F_C$ as a low-frequency corner frequency. The input to the high-pass filter 100 is voltage $V_{in}$ and the output of the high-pass filter 100 is voltage $V_{outps}$. The operational amplifier 102 and the capacitor 104 and resistor 106, resistor 108 $R_1$, and resistor 110 $R_2$ form an (inverting) Active-RC low-pass filter circuit from the node at the output of summing circuit 116 shown as voltage $V_{out}$ to the node at $V_L$ which is the output of the operational amplifier 102.

Equation 1 illustrates the Laplace transform.

$$\frac{V_L(s)}{V_{out}(s)} = -\frac{1/RC}{s + g_0/C} \quad (1)$$

where R is the total value of the combination resistances of resistor 106, resistor 108 and resistor 110, and depending on input signals $B_1$ and $B_2$ where input signal $B_1$ and input signal $B_2$ are digital signals as illustrated in Equation 2.

$$R = \begin{cases} R_0 + R_1 + R_2 & \text{if } B_1 = \text{``LOW''} \text{ and } B_2 = \text{``LOW''} \\ R_0 + R_1 & \text{if } B_2 = \text{``HIGH''} \\ R_0 & \text{if } B_1 = \text{``HIGH''} \end{cases} \quad (2)$$

Thus, the input signals $B_1$ and $B_2$ control the total resistance by effectively shorting resistor 108 and resistor 102 through switches 112 and 114.

The parameter $g_0$ in Equation 1 is the parasitic conductance across capacitor 104.

The summation circuit 116 sums voltage $V_{in}$ and voltage $V_L$ as illustrated in Equation 3.

$$V_{out}(S) = V_{in}(S) + V_L(S). \quad (3)$$

Substituting Equation 1 in Equation 3 yields Equation 4.

$$\frac{V_{out}(s)}{V_{in}(s)} = \frac{s + g_0/C}{s + (g_0 + 1/R)/C} \quad (4)$$

Equation 4 is the first order high-pass filter Laplace domain transfer function, for which the cutoff frequency is illustrated in Equation 5.

$$F_c = \frac{1}{2\pi} \frac{g_0 + 1/R}{C} \quad (5)$$

The zero frequency is derived in Equation 6.

$$F_z = \frac{1}{2\pi} \frac{g_0}{C} \quad (6)$$

The cutoff frequency and the zero frequency are illustrated as high-pass filter magnitude characteristics as shown in FIG. 2.

The circuit 100 uses three settings of R which correspond to fast, slow and medium speeds in order to adjust the corner frequency $F_C$. The circuit of FIG. 1 requires an input signal for each switch to control the resistance. Thus, there is no trimming due to process variations.

SUMMARY OF THE INVENTION

The present invention provides a filter which is both programmable and trimmable. The programmable and trimmable features are summed and input to a programmable resistor through a single line. Thus, the programmable feature and trimmable feature are combined.

BRIEF DESCRIPTION OF THE DRAWINGS

FIG. 3 illustrates a high-pass filter of the present invention;

FIG. 4 illustrates a programmable resistor array of the present invention;

FIG. 7 illustrates cutoff frequency versus corner frequency;

FIG. 8 illustrates cutoff frequency versus trimming control; and

FIG. 9 illustrates computed resistor values.

DETAILED DESCRIPTION OF THE PRESENT INVENTION

Figure 1:
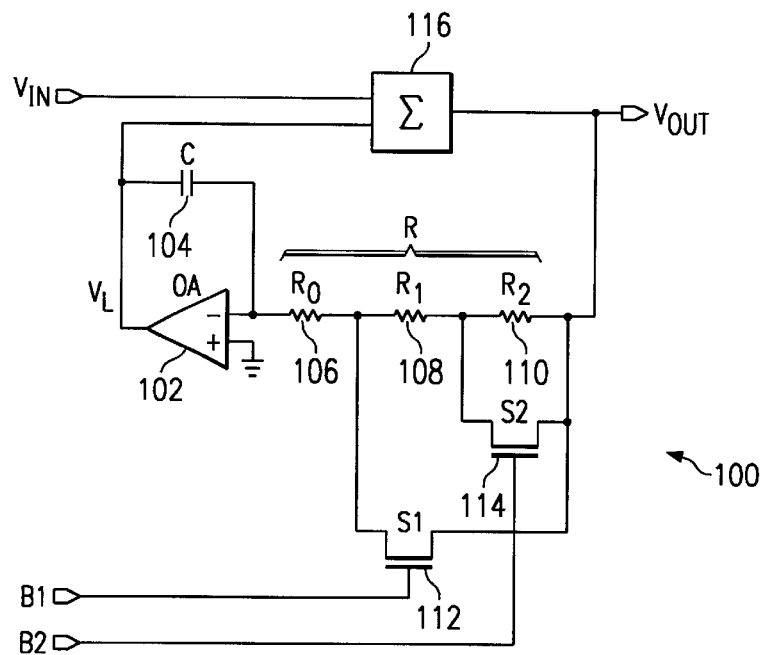
FIG. 1 illustrates a high-pass filter.
Figure 2:
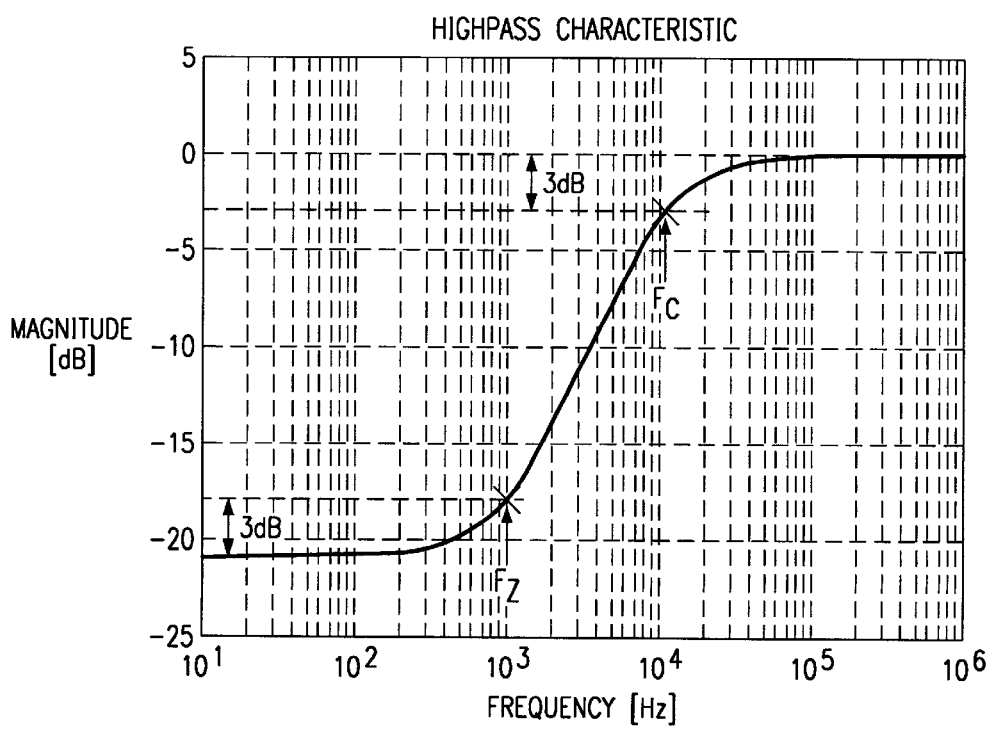
FIG. 2 illustrates the characteristics of a high-pass filter.

As illustrated in FIG. 3, the high-pass circuit 300 includes an summation circuit 316 to sum the output of operational amplifier 302 and the voltage $V_{in}$. The voltage $V_{in}$ and the output of the operational amplifier 302, namely voltage $V_L$, is summed by summation circuit 316. The output of summation circuit 316 enters a feedback circuit including a programmable resistance 320. The output of the programmable resistance 320 is input to the operational amplifier 302. The other input to the operational amplifier 302 is connected to ground. The output of the operational amplifier 302 is connected to capacitor 304 with the output of programmable resistance 320 connected to capacitor 304. The input to the programmable resistance 320 is the output of decoder circuit 322 which is connected to summation circuit 324. The input to the summation circuit 324 is the trimming signal TRIM and the programmable signal FC. Both the programmable value FC and the trimming value TRIM are binary values. The binary values (FC and TRIM) are summed by the operational amplifier 302. The programmable resistor 320, operational amplifier 302, and the capacitor 304 form the low-pass filter. The summing circuit 316 adds the input signal, voltage $V_{in}$, and the output of the operational amplifier 302, voltage signal $V_L$. Voltage $V_{out}$ is the output of the first order high-pass filter.

The present invention provides a common resistor array for both the trimming and programming aspects of the present invention. The decoder circuit 322 transforms the digital output of the adder circuit 324 to a single-bit output so that a predetermined FET can be turned on to control the resistance seen by the programmable resistor. As illustrated in FIG. 3, the program FC is a 4-bit word represented by FC(3:0), a digital signal, to address in some instances 16 resistors to provide the necessary programmability. The trimming signal TRIM(2:0) requires in some instances seven more resistors to increase and decrease the total resistor value of seven steps total up and down. The adder circuit 324 adds, for example, a 3-bit digital trimming signal to a 4-bit digital programming signal to create a 5-bit combination signal FCT(4:0). The decoder outputs a decoded signal on a common control line 321. The 5-bit decoder circuit 322 decodes the signal FCT(4:0) into a 23-bit signal B(22:0) such that $$B(n) = \begin{cases} \text{``HIGH''} & \text{if } FCT \text{ (decimal)} = n \\ \text{``LOW''} & \text{if else,} \end{cases} \quad (7)$$

where $n: 0 \ldots 22$.

Other bit combinations work equally well. FIG. 4 illustrates a programmable resistor array. Thus, a signal $B_{19}$ equals a logical "1" in the 19th position with logical "0"s in all the other positions, which is a common array to the trimming signal and the programming signal, and FET 402 is turned on by the signal $B_{19}$, and resistors 404, 406, 408 and 410 are in the circuit while the rest of the resistors of circuit are not shorted. Thus, by controlling the various B signals to be a logical "1" or a logical "0," the amount of resistance can be varied in accordance with a combination of program and trim signals.

Figure 5:
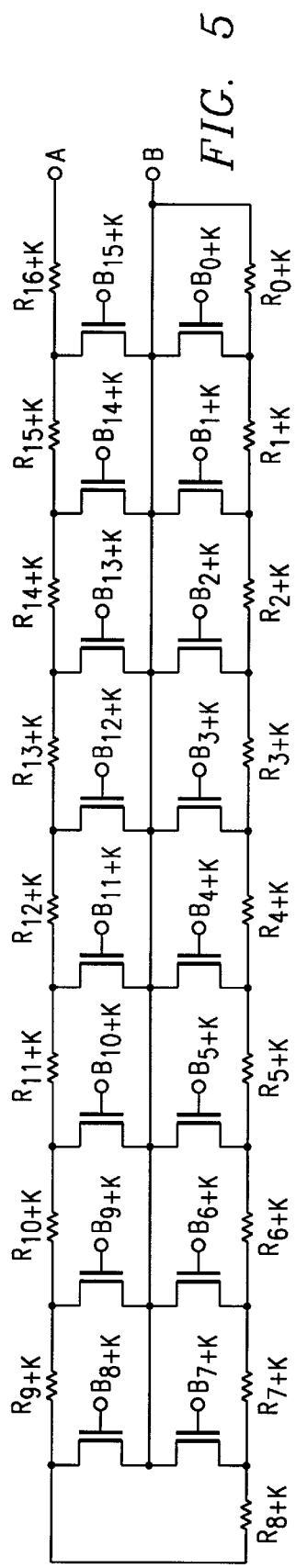
FIG. 5 illustrates a second programmable array.

For a trimming control signal, only a group of 16 consecutive switches are turned off or on, for instance, 3 through 18. The others are always turned off for trimming, so as a consequence, the resistor structure as shown in FIG. 4 can be simplified to the one in FIG. 5. In FIG. 4 and FIG. 5, the relationship between the resistor values is illustrated in Equation 8.

$$R_{i+K} = \begin{cases} R_{i+K} & \text{if } i < 16 \\ \sum_{j=16+K}^{23} R_j & \text{if } i = 16, \end{cases} \quad (8)$$

where $i: 0 \ldots 16$ and $K: 0 \ldots 7$.

For a given trimming setting, FC, which is the digital signal controlling the corner frequency $F_C$, changes from 0 to 15 in decimal. The $R_{prog}$ value for a given FC is illustrated in Equation 9.

Figure 6:
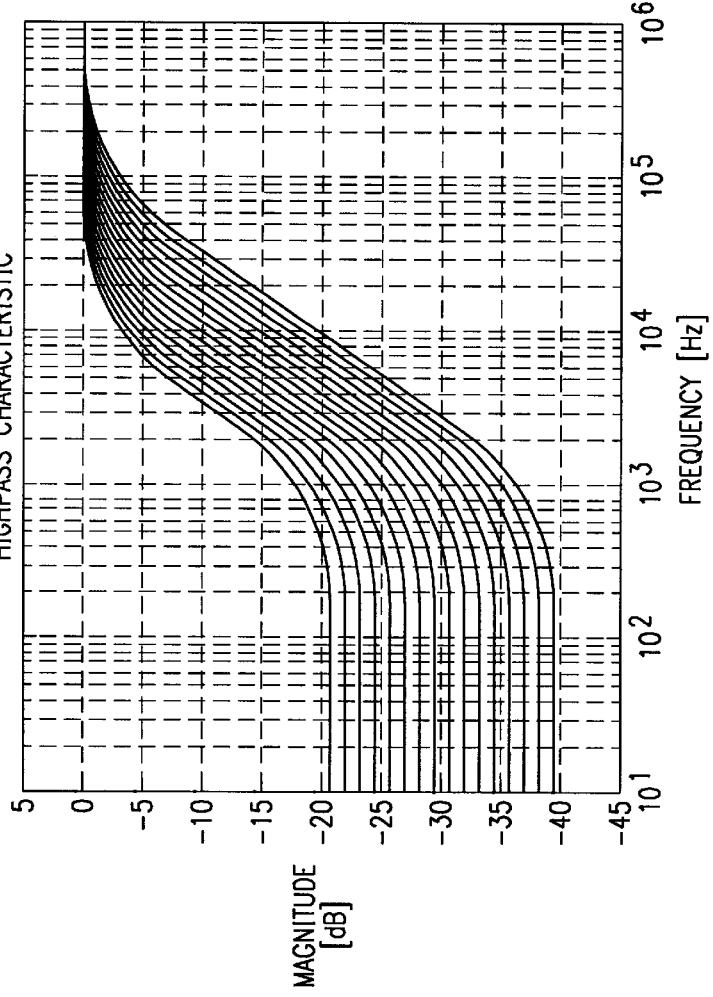
FIG. 6 illustrates high-pass characteristics of the present invention.

It is often useful to vary the cutoff frequency in equal steps in the logarithmic scale. FIG. 6 illustrates an example of programming $F_C$. The $F_C$ variation versus FC(3:0) control is linear in logarithmic scale as shown in FIG. 7.

In order to obtain equal steps of programming in logarithmic frequency scale, it is desirable to have the following relationship between two consecutive values of programmed $F_C$ as illustrated in Equation 10.

$$F_{C(i+1)} = a \, F_{C(i)} \quad (10)$$

Since capacitor value C in design is kept constant, assuming that $1/g_0$ is negligible with respect to the largest resistor setting, $F_C$ is varied by varying the resistor value $R_{prog}$ as illustrated in Equation 11.

$$R_{prog(i+1)} = \left(\frac{1}{a}\right) R_{prog(i)} \quad (11)$$

The relationship between the resistor values of the consecutive resistors in the resistor array can be obtained by substituting Equation 9 for FC=i and FC=i+1 into Equation 11 as illustrated in Equation 12.

$$\sum_{j=i+1}^{16+K} R_j = \frac{1}{a} \sum_{j=i}^{16+K} R_j \quad \text{where } i: 0 \ldots (15+K) \quad (12)$$

This implies Equation 13.

$$R_i = (a-1) \sum_{j=i+1}^{16+K} R_j \quad \text{where } i: 0 \ldots (15+K). \quad (13)$$

By induction, it can be shown that $$R_i = a \, R_{i+1} \text{ where } i: 0 \ldots (14+K) \quad (14)$$

Write Equation 13 for i+1, that is $$R_{i+1} = (a-1) \sum_{j=i+2}^{16+K} R_j \quad \text{where } i: 0 \ldots (14+K). \quad (15)$$

Next, add $(a-1)R_{i+1}$, to both sides of Equation 15, and Equation 16 results.

$$aR_{i+1} = (a-1) \sum_{j=i+2}^{16+K} R_j + (a-1) R_{i+1} = \quad (16)$$

$$(a-1) \sum_{j=i+1}^{16+K} R_j = R_i \text{ where } i: 0 \ldots (14+K),$$

This proves Equation 14. Also, from Equation 13, Equation 17 follows.

$$R_{15+K} = (a-1) R_{16+K} \text{ where } i: 0 \ldots (15+K). \quad (17)$$

From Equation 14 and Equation 17, it can be proven that $$R_i = a^{15+K-i}(a-1) R_{16+K} \text{ where } i: 0 \ldots (15+K) \quad (18)$$

If the cutoff frequency is required to vary N times while within the programming range, assuming that $1/g_0$ is negligible with respect to the largest resistor setting, that implies Equation 19.

$$R_{16+K} = \left(\frac{1}{N}\right) \sum_{j=0+K}^{16+K} R_j = \left(\frac{1}{N}\right) \left[ \sum_{j=0+K}^{15+K} a^{15+K-i}(a-1)R_{16+K} + R_{16+K} \right] \quad (20)$$

Substituting Equation 18 into Equation 20 yields Equation 21.

$$R_{16+K} = \left(\frac{1}{N}\right) R_{16+K} \left[ (a-1)\sum_{j=0}^{15} a^j + 1 \right] \quad (21)$$

This implies Equation 22.

$$(a-1)\sum_{j=0}^{15} a^j + 1 = N \quad (22)$$

And as shown in Equation 23, $$(a-1)a^{16} - \frac{1}{a-1} = N - 1 \quad (23)$$

the result is Equation 24.

$$a = \sqrt[16]{N}. \quad (24)$$

For the practical example for the present invention, it was determined that N=10, that gives Equation 25.

$$a = 1.154781985. \quad (25)$$

It is practical also to make the nominal setting of the trimming to be centered with respect to the trimming range as shown in FIG. 8. It corresponds to K=4.

The numerical resistor values are computer as follows. The highest setting of FC(3:0) corresponds to the highest $F_C$ programmed, as can be shown in FIG. 7. Now let us call that $F_C$ value $F_{C(max)}$. According to Equation 5, Equation 26 results.

$$R_{(min)} = \frac{1}{2\pi F_{C(max)} C - g_0} \quad (26)$$

Assuming that $g_0$ is known, in fact, by design, Equation 27 results.

$$R_{(min)} = R_{16+K} \quad (27)$$

For K=4, Equation 28 results.

$$R_{(min)} = \sum_{j=20}^{23} R_j. \quad (28)$$

Since the same numeric resistor values are valid for any K, Equation 29 results.

$$R_{22} = (a-1)R_{23} \quad (29)$$

According to Equation 17, for K=7 and from Equation 14, Equation 30 results.

$$R_i = a\, R_{i+1} \text{ where } i:20,21. \quad (30)$$

It can be computed that $$R_{(min)} = a^3 R_{23}, \quad (31)$$

From Equations 20 and 30, therefore, Equation 32 results.

$$R_{23} = \frac{1}{a^3} R_{(min)} = \frac{1}{a^3} \frac{1}{2\pi F_{C(max)} C - g_0}. \quad (32)$$

Then, $R_{22}$ is computed by Equation 29 and the remainder is computed by Equation 33.

$$R_i = a\, R_{i+1} \text{ where } i:0,\ldots,21. \quad (33)$$

Thus, the entire design of all component values are computed.

FIG. 9 illustrates a table of computed resistor values assuming that $$F_{C(max)} = 40 kHz,$$

$$g_0 = 0.05\ \mu\text{mhos},$$

and it is chosen that $$C = 100 pF.$$

The achieved minimum and maximum $F_C$ are computed as $$F_{C(min)} = 40 kHz,$$

and $$F_{C(min)} = 4.07 kHz.$$

The inaccuracy in the $F_{C(min)}$ is due to the $1/g_0$ term in Equation 5.

What is claimed is:

1. A high-pass filter comprising:
    a variable resistance having a resistance which can be varied;
    a capacitor coupled to an output of said variable resistance; and
    an operational amplifier coupled to said output of said variable resistance and said capacitor;
    wherein said variable resistance may be varied in accordance with a discrete trimming signal and a discrete programming signal;
    wherein said trimming signal and said programming signal are summed together by an adder circuit.

2. A high-pass filter as in claim 1, wherein said trimming signal and said programming signal are through a common control line.

3. A high-pass filter as in claim 1, wherein said trimming signal and said programming signal are decoded by a decoder circuit.

4. A high-pass filter as in claim 1, wherein said trimming signal and said programming signal vary the resistance of a common array.

* * * * *